(12) United States Patent
Yang et al.

(10) Patent No.: US 10,644,662 B2
(45) Date of Patent: May 5, 2020

(54) TUNABLE GAIN AMPLIFIER

(71) Applicant: Taiwan Semiconductor Manufacturing Company, Ltd., Hsinchu (TW)

(72) Inventors: Shu-Chun Yang, Hsinchu (TW); Wei Chih Chen, Hsinchu (TW); Yu-Nan Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/825,400

(22) Filed: Nov. 29, 2017

(65) Prior Publication Data

US 2019/0165744 A1 May 30, 2019

(51) Int. Cl.
*H03F 3/45* (2006.01)

(52) U.S. Cl.
CPC ........... *H03F 3/45076* (2013.01); *H03F 3/45* (2013.01); *H03F 3/45179* (2013.01); *H03F 3/45197* (2013.01); *H03F 3/45632* (2013.01); *H03F 2203/45702* (2013.01)

(58) Field of Classification Search
CPC .... H03F 3/45076; H03F 3/45; H03F 3/45183; H03F 1/34; H03F 3/45479; H03F 3/4565; H03F 3/45659; H03F 3/45475; H03F 3/191; H03F 3/193; H03F 2200/372; H03F 2200/546; H03F 200/372; H03G 1/0023; H03G 1/0029; H03G 1/0035; H03G 1/0088; H03G 3/00; H03G 2201/10
USPC ........................................ 330/254, 258, 305
See application file for complete search history.

(56) References Cited

U.S. PATENT DOCUMENTS

| | | | | |
|---|---|---|---|---|
| 7,592,870 B2* | 9/2009 | Wang | ........................ | H03F 1/26 330/258 |
| 7,792,185 B2* | 9/2010 | Bulzacchelli | ............ | H03K 5/02 375/233 |
| 8,378,714 B2* | 2/2013 | Liang | ................... | H03F 3/45183 326/113 |
| 8,633,764 B2* | 1/2014 | Agrawal | ................. | H03F 3/211 327/336 |
| 10,243,531 B1* | 3/2019 | Thiagarajan | ............ | H03G 3/30 |
| 2013/0049866 A1* | 2/2013 | Li | ........................... | H03F 3/193 330/277 |

* cited by examiner

*Primary Examiner* — Khanh V Nguyen
(74) *Attorney, Agent, or Firm* — Merchant Gould P.C.

(57) ABSTRACT

A amplifier circuit in some embodiment includes a differential amplifier have a pair of current sources. Each of the current sources includes two or more current-generating transistors and respective switching transistors, which can be turned on and off by a gain input code to tune the gain of the amplifier. A common-mode controller includes a similar pair of current sources as the differential amplifier. The common mode controller receives a common-mode signal of the input signal and a common-mode gain input code, and maintains the common-mode gain of the amplifier circuit when the differential gain changes. The amplifier circuit is switchable between a buffer mode and an equalizer mode.

18 Claims, 10 Drawing Sheets

TUNABLE GAIN AMPLIFIER

BACKGROUND

Amplifiers and equalizers are commonly used in high-speed circuits. For short-channel applications, simple amplification may suffice. For long-channel application, equalizers may be used to boost certain spectral portions of the signal relative to other portions.

Voltage gain amplifiers (VGAs) and continuous-time linear equalizers (CTLEs) can be used to compensate signal losses. To minimize distortion, a configuration of a CTLE following a VGA can be used. However, such a configuration diminishes the overall bandwidth. Additionally, some traditional VGAs use source degeneration variable resistors for gain control. However, parasitic capacitor effect produces unwanted high amplitude in gain (overpeaking) in the high-frequency ranges of the frequency response. While certain traditional modifications of VGAs may reduce such overpeaking, such modifications can lead to degradation of the overall bandwidth.

Efforts in designing amplifiers and equalizers with improved characteristics are therefore ongoing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
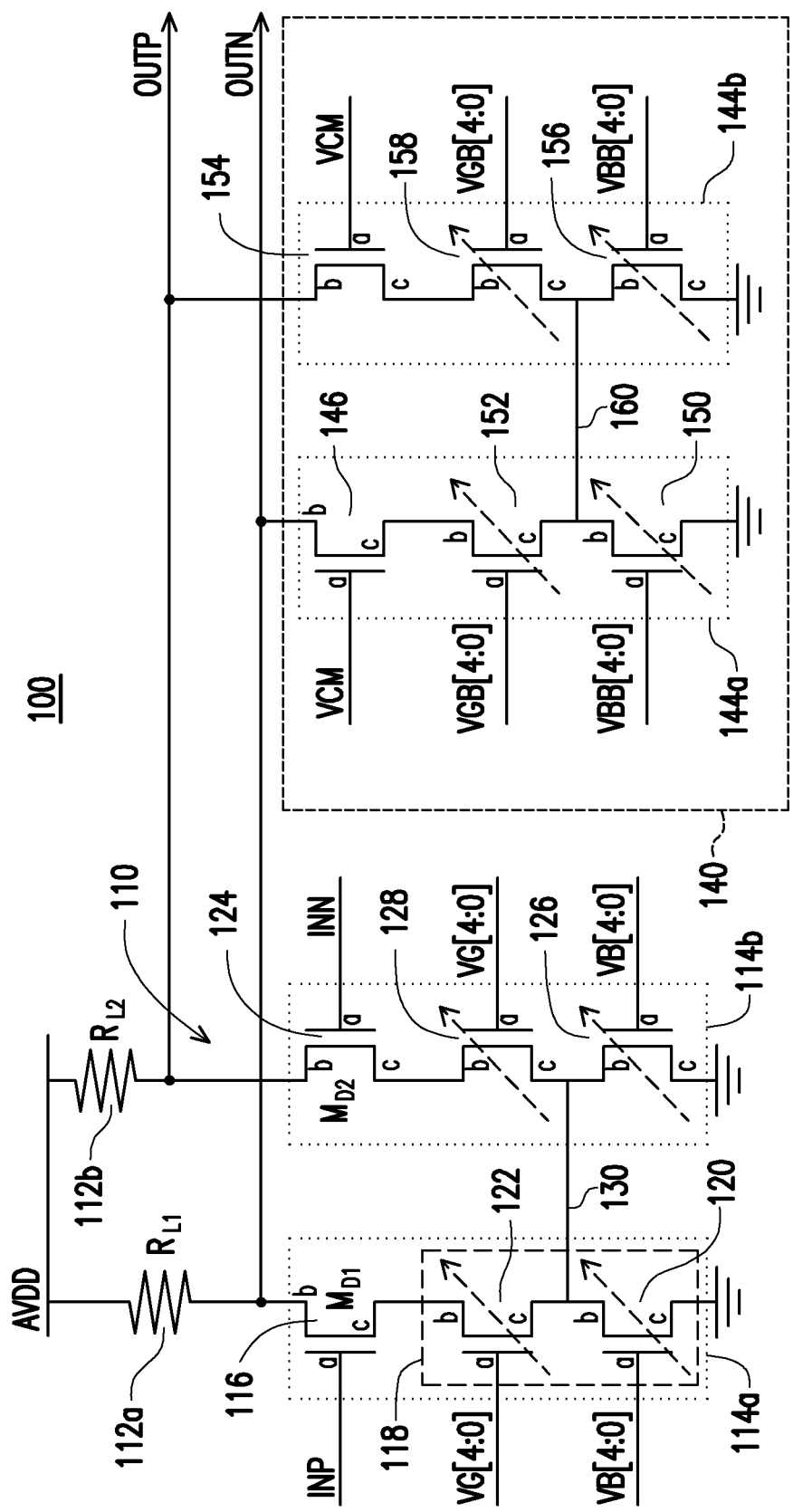
FIG. 1 shows a schematic diagram of a voltage gain amplifier (VGA) in accordance with some embodiments.

The following disclosure provides many different embodiments, or examples, for implementing different features of the provided subject matter. Specific examples of components and arrangements are described below to simplify the present disclosure. These are of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Amplifiers and equalizers are commonly used in high-speed circuits. For short-channel applications, where spectral distortion is within design tolerance, simple amplification may suffice. For long-channel application, where spectral distortion needs to be corrected, equalizers may be used to boost certain spectral portions of the signal relative to other portions.

For example, voltage gain amplifiers (VGAs) and continuous-time linear equalizers (CTLEs) can be used to compensate signal losses. To minimize distortion, a configuration of a CTLE following a VGA can be used. However, such a configuration diminishes the overall bandwidth. For example, the overall bandwidth for a three-band configuration is about 0.35*(bandwidth of a single band). Additionally, some traditional VGAs use source degeneration variable resistors for gain control. However, parasitic capacitor effect produces unwanted peaking (overpeaking) in the high-frequency ranges of the frequency response. While placing extra capacitance in the output of VGAs may reduce such overpeaking, the extra capacitance can lead to degradation of the overall bandwidth.

In accordance with certain aspects of the present disclosure, certain embodiments include VGAs or combination VGA/Equalizers with tunable gain; other embodiments include related methods, such as signal processing with VGAs or combination VGA/Equalizers with tunable gain. In accordance with one aspect of the disclosure, tunable gain of a VGA is achieved by digitally changing the current in a differential amplifier instead of using a source degeneration variable resistor. The elimination of the degeneration variable resistor reduces overpeaking and spectral distortion (for example, as indicated by distortion in eye diagrams). The reduced overpeaking and spectral distortion, in turn, result in improvement in the overall bandwidth. In certain embodiments, combination VGA/equalizers can be configured to operate in either a buffer mode or equalizer mode, both with tunable gain, thereby providing flexibility of circuit design and layout.

As schematically shown in FIG. 1, an example VGA 100 in accordance with an aspect of the disclosure includes a differential amplifier 110, which includes a pair of loads $R_{L1}$ 112a and $R_{L2}$ 112b, and a pair of input-bias circuits 114a, 114b. The input-bias circuits 114a,114b can have symmetrical structures or share common structures, which will be described below with reference to the input-bias circuit 114a.

The input-bias circuit 114a, according to some embodiments, includes an effective input transistor 116 having a control electrode 116a, a first main electrode 116b and a second electrode 116c. The input-bias circuit 114a further includes a current source 118, which includes an effective variable current-generating transistor 120 and effective multi-input switching transistor 122. The effective transistor 120 and 122, as explained in more detail below, can be turned on and off to tune the gain of the amplifier (the tuning function of transistors is indicated by the dashed arrows across the respective transistors in FIGS. 1 and 3). The effective variable current-generating transistor 120 has a control electrode 120a, a first main electrode 120b and a second main electrode 120c, which is connected to a voltage supply, in this example the ground. The effective switching transistor 122 has a control electrode 122a, a first main electrode 122b connected to the second main electrode 116c of the effective input transistor 116, and a second main electrode 122c, connected to the first main electrode 120 of the effective current-generating transistor 120. The first main electrode 116b is connected to the load 112a, which in this example is a resistor $R_{L1}$ but can be any other suitable circuitry, such as a passive or active load, including components such as resistors, capacitors, diodes and transistors. The junction between the first main electrode 116b and the load 112a provides an output signal OUTN. Similarly, the junction between the first main electrode 124b and the load 112b provides another output signal OUTP. The other ends of the loads 112a and 112b are connected to a voltage supply, in this example AVDD.

The control electrode 116a of the effective input transistor 116 is an input electrode for receiving one input INP. Similarly, the input-bias circuit 114b includes an effective input transistor 124, which has a control electrode 124a for receiving another input INN. The voltage difference, $V_{INP}-V_{INN}$, is the differential input signal to the differential amplifier 110. The control electrode 120a of the effective variable current-generating transistor 120 is adapted to receive an effective biasing signal VB. The variable current-generating transistor 120 generates a variable current through the first main electrode 120b. The control electrode 122a of the effective switching transistor 122 is adapted to receive a gain input signal VG, which determines the amount of current flowing through the effective input transistor 116, and thus the gain of the differential amplifier 110.

The input-bias circuit 114b is similar or identical to the input-bias circuit 114a, and includes an effective current-generating transistor 126 and effective switching transistor 128, in addition to the effective input transistor 124. In the example in FIG. 1, the first main electrodes 120b and 126b are connected to each other via a conductive, or substantially purely resistive, path 130. In this configuration, the differential amplifier 110 is configured in a buffer mode, or as a VGA. Alternatively, an equalizer unit 330, show in the example circuit 300 in FIG. 3, which is otherwise the same as FIG. 1, can be used in place of the path 130 to configure the differential amplifier 110 in an equalizer mode, or as an CTLE. In the example shown in FIG. 3, the equalizer unit 330 is a resistor-capacitor combination, such as a resistor and capacitor connected in parallel. However, other components or combinations of components, such as inductors, in any suitable configuration, with one or more frequency-dependent properties, can be used. Additionally, an equalizer unit 330 with a variable equalization characteristic, such as a variable high-frequency gain relative to low-frequency gain can be used. In some example, such a variable equalizer unit 330 can be implemented with multiple resistors or resistor-capacitor combinations that can be selectively switched into the path 130. The switching can be accomplished in some examples by switching transistors turned on and off by gate/base signals. The gate/base signals can form a binary code indicative of the selected configuration of the equalizer unit 330.

Figure 9:
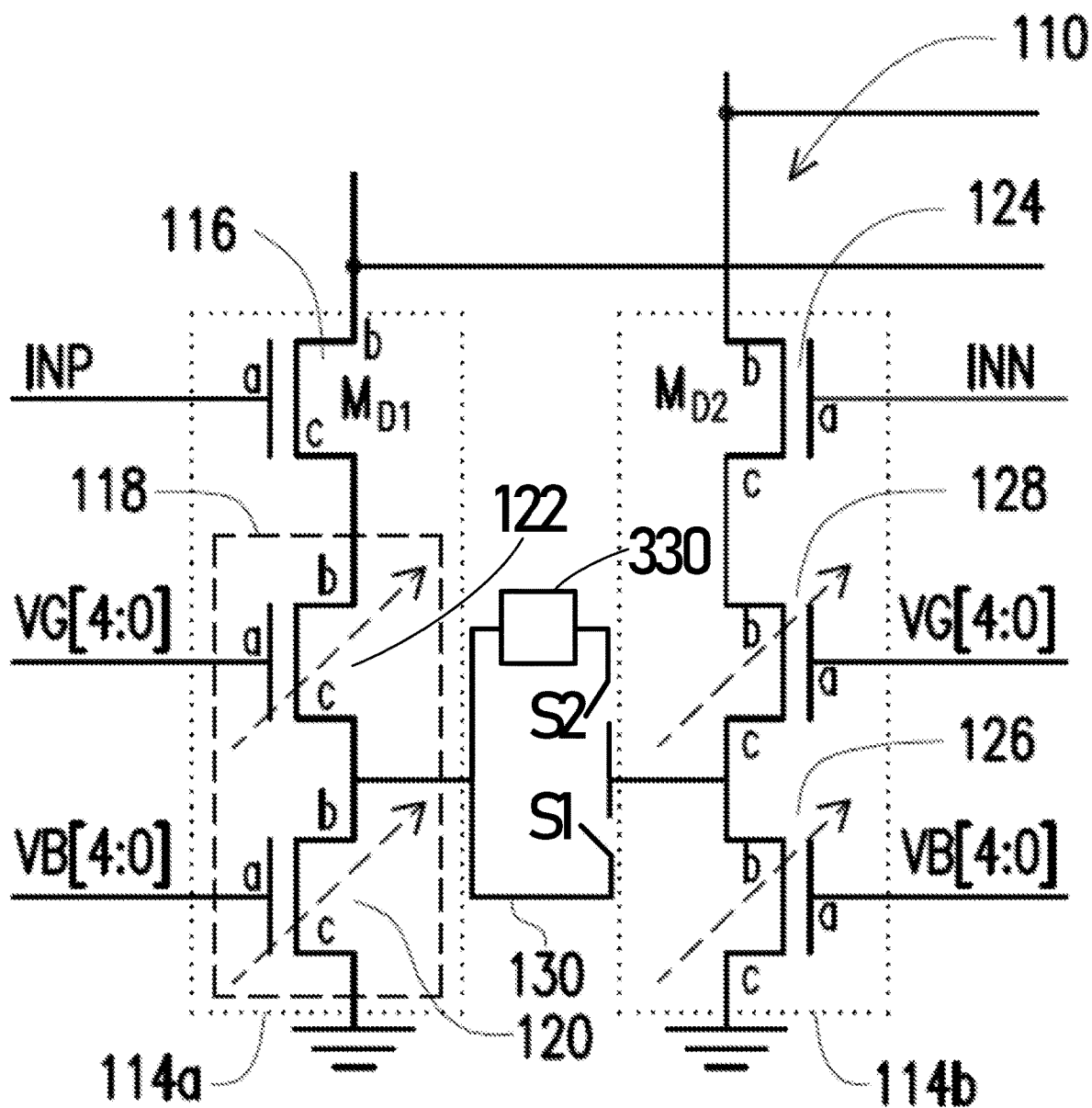
FIG. 9 schematically shows a differential amplifier in a VGA similar to those shown in FIGS. 1 and 3 but with multiple connecting elements alternately connectible between the current sources to configure the VGA alternately as a buffer or equalizer in accordance with some embodiments.

In a further example embodiment, shown in FIG. 9, the conductive (or resistive) path 130 and equalizer unit 330 can both be present in the circuit 100 or 300 but be alternately connected between the effective current-generating transistors 120 and 126. For example, one or more switching devices (S1, S2), such as one or more switching transistors (not shown) can be used to make the connection or connections. The circuit 100 or 300 can thus be readily configured as a VGA or equalizer. In both configurations, a tunable gain is achieved by digitally adjusting the currents in the input-bias circuits 114a and 114b. Because the gain can be varied without the use of a degeneration variable resistor, overpeaking and signal distortion are reduced, resulting in improved bandwidth.

The amplifier circuit 100 and 300 also each include a common-mode controller 140, which includes a pair of input-bias circuits 144a and 144b. The input-bias circuits 144a and 144b are identical or similar to the input-bias circuits 114a and 1141 in the differential amplifier 110. In the embodiment shown in FIG. 1, for example, the input-bias circuit 144a includes an effective input transistor 146 having a control electrode 146a, a first main electrode 146b and a second main electrode 146c. The input-bias circuit 144a further includes a current source that includes an effective variable current-generating transistor 150 and effective multi-input switching transistor 152. The effective variable current-generating transistor 150 has a control electrode 150a, a first main electrode 150b and a second main electrode 150c, which is connected to a voltage supply, in this example the ground. The effective switching transistor 152 has a control electrode 152a, a first main electrode 152b connected to the second main electrode 146c of the effective input transistor 146, and a second main electrode 152c, connected to the first main electrode 150b of the effective current-generating transistor 150. The input-bias circuit 144b is similar or identical to the input-bias circuit 144a, and includes an effective current-generating transistor 156 and effective switching transistor 158, in addition to the effective input transistor 154. In the example in FIG. 1, the first main electrodes 150b and 156b are connected to each other via a conductive, or substantially purely resistive, path 160.

The input-bias circuits 144a and 144b are connected to the rest of the amplifier circuit differently from the input-bias circuits 114a and 114b, respectively. The control electrodes 146,154 of the effective common-mode input transistors 146,154 are connected to receive a signal corresponding to a common-mode signal of the input signals IMP and INN. In some examples, control electrodes 146,154 of the effective common-mode input transistors 146,145 are connected to receive the common-mode signal itself VCM. That is, VCM=$(V_{INP}+V_{INN})/2$. The first main electrodes 146b and 154b of the effective common-mode input transistors 146, 154 are connected to the output OUTN and OUTP, respectively. The output of the common-mode controller 140, thus, is a signal indicative of the common-mode signal and is used in some embodiments, as explained below in connection with FIGS. 5 and 6, to maintain the common-mode gain as the gain of the differential amplifier 110 is changed.

The control electrodes 150a and 156a are adapted to receive biasing signals VBB, which, as discussed in more detail below, are correlated with the biasing signal VB for the differential amplifier 110. Similarly the control electrodes 152a and 158a are adapted to receive common-mode gain input signals VGB, which, as discussed in more detail are correlated with the gain input signal VB for the differential amplifier 110.

In accordance with some embodiments, the input-bias circuit 114a can be implemented by using two or more transistors for each effective transistor 116, 120 and 122. For example, each of the effective transistors 116,120,122 can be implemented by four transistors to implement a four-bit tuning circuit (hence the notation ")" in FIG. 1) to achieve sixteen-level ($2^4$) tuning granularity. The principles of such implementation are described below with a two-bit implementation (FIG. 5) and six-bit implementation (FIG. 6) but are generally applicable to achieve any level of tuning, i.e., n-bit tuning, where n is a positive integer. The input-bias circuits 114b, 144a and 144b can be similarly implemented. Detailed explanations of the implementations of the input-bias 114a only will therefore be given below.

Figure 5:
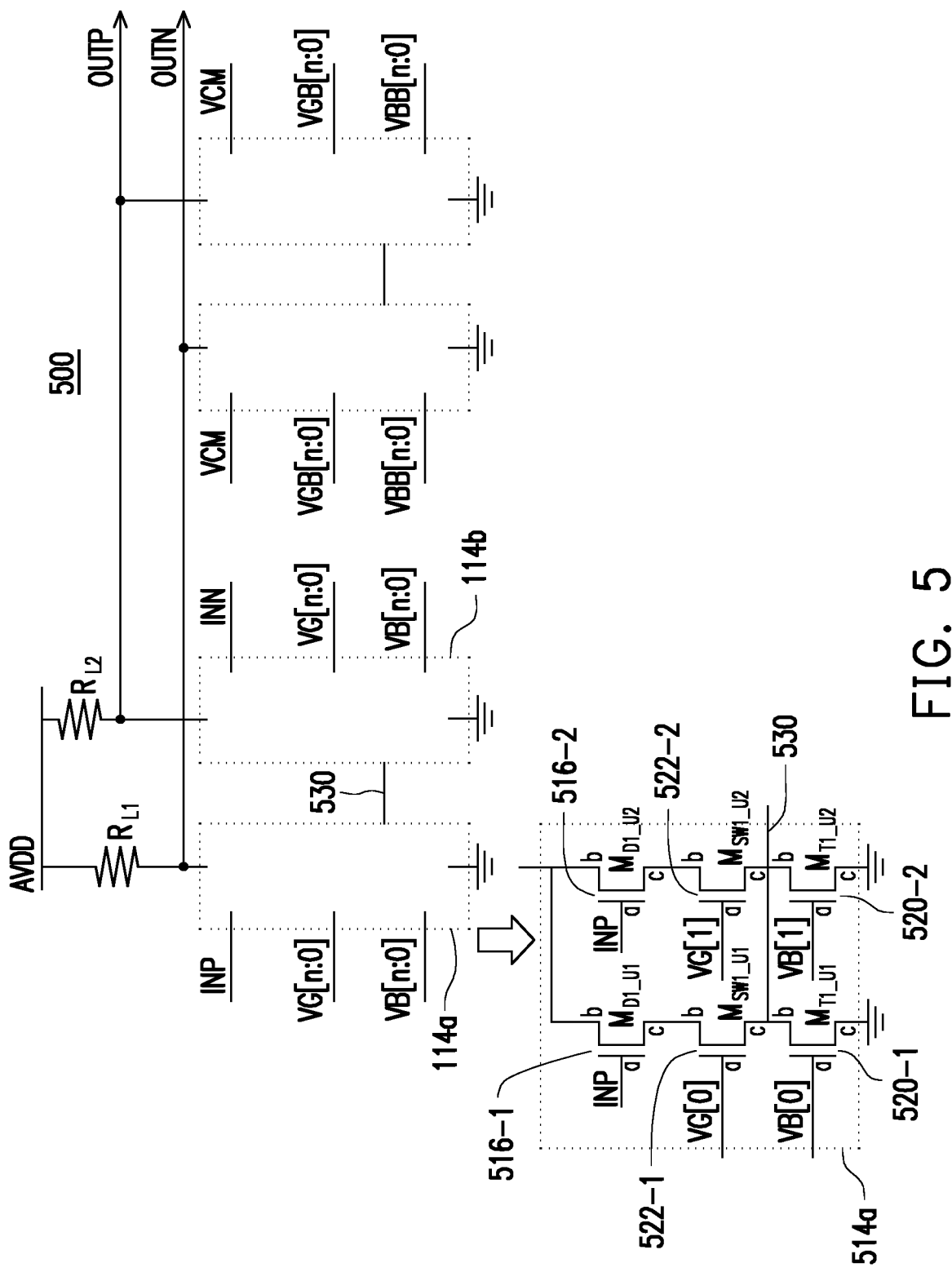
FIG. 5 shows an example VGA of the type shown in FIG. 1, with a two-bit gain control in accordance with some embodiments.

Referring to FIG. 5, the input-bias circuit 114a of a VGA circuit 500 is, in one example, implemented by a two-bit tuning circuit 514a. The effective input transistor 116 is implemented by two input transistors 516-1 and 516-2; the effective current-generating transistor 120 is implemented by two current-generating transistors 520-1 and 520-2; and the effective switching transistor 122 is implemented by two switching transistors 522-1 and 522-2. Both control electrodes 516-1a,516-2a of the input transistors 516-1,516-2, respectively, are connected to the input INP; the control electrodes 520-1a,520-2a of the current-generating transistors 520-1,520-2, respectively, are connected to respective analog biasing voltages VB[0] and VB[1], respectively; and the control electrodes 522-1a,522-2a of the switching transistors 522-1,522-2, respectively, are connected to respective bits VG[0] and VG[1], respectively, of a digital gain input VG. The other input-bias circuit 114b of the VGA circuit 500 in this embodiment is identically implemented as the input-bias circuit 114a (the details of the input-bias circuit 114b is not illustrated in FIG. 5 for clarity). A conductive line 530 in this example embodiment connects the first main electrodes 520-1b and 520-2b of the current-generating transistors 520-1 and 520-2, respectively, as well as the corresponding currently-generating transistors in the input-bias circuit 114b.

Thus, in the example of a binary code for VG, there are four states of current-generating transistors 520-1,520-2 (all binary codes expressed in base-2): For VG=00 (i.e., VG[0]=0 and VG[1]=0), both current-generating transistors are off; for VG=01 (i.e., VG[0]=1 and VG[1]=0), the current-generating transistors 520-1,520-2 are off and on, respectively; for VG=10 (i.e., VG[0]=0 and VG[1]=1), the current-generating transistors 520-1,520-2 are on and off, respectively; and for VG=11 (i.e., VG[0]=1 and VG[1]=1) the current-generating transistors 520-1,520-2 are both on.

In some embodiments, the "size" of each current-generating transistor, i.e., the current it generates when it is on, can be set to correspond to the bit weight of the switching transistor associated with the current-generating transistor. Thus, for example, the "size" of the transistor 520-2 can be twice the "size" of the transistor 520-1. The total current generated by the transistors 520-1 and 520-2 is thus proportional to the binary code VB applied to the switching transistors 522-1 and 522-2. As the gain of the amplifier 500 is proportional to the square root of the current, the gain can therefore be tuned by providing different binary codes VB For example, maximum gain is achieved when VB=11, and minimum gain is achieved when VB=00.

In accordance with some embodiments, the common gain can be maintained for the circuit shown in FIG. 5 by keeping the common-mode gain input code VGB complementary (e.g., 1's complement) to VG. For example, for VG=10, VGB can be set to VGB=01.

While the example in FIG. 5 is a VGA, a similar implementation can be made for an equalizer or combination VGA/equalizer with a 2-bit tunable gain (or other tuning levels such as those described below).

Figure 6:
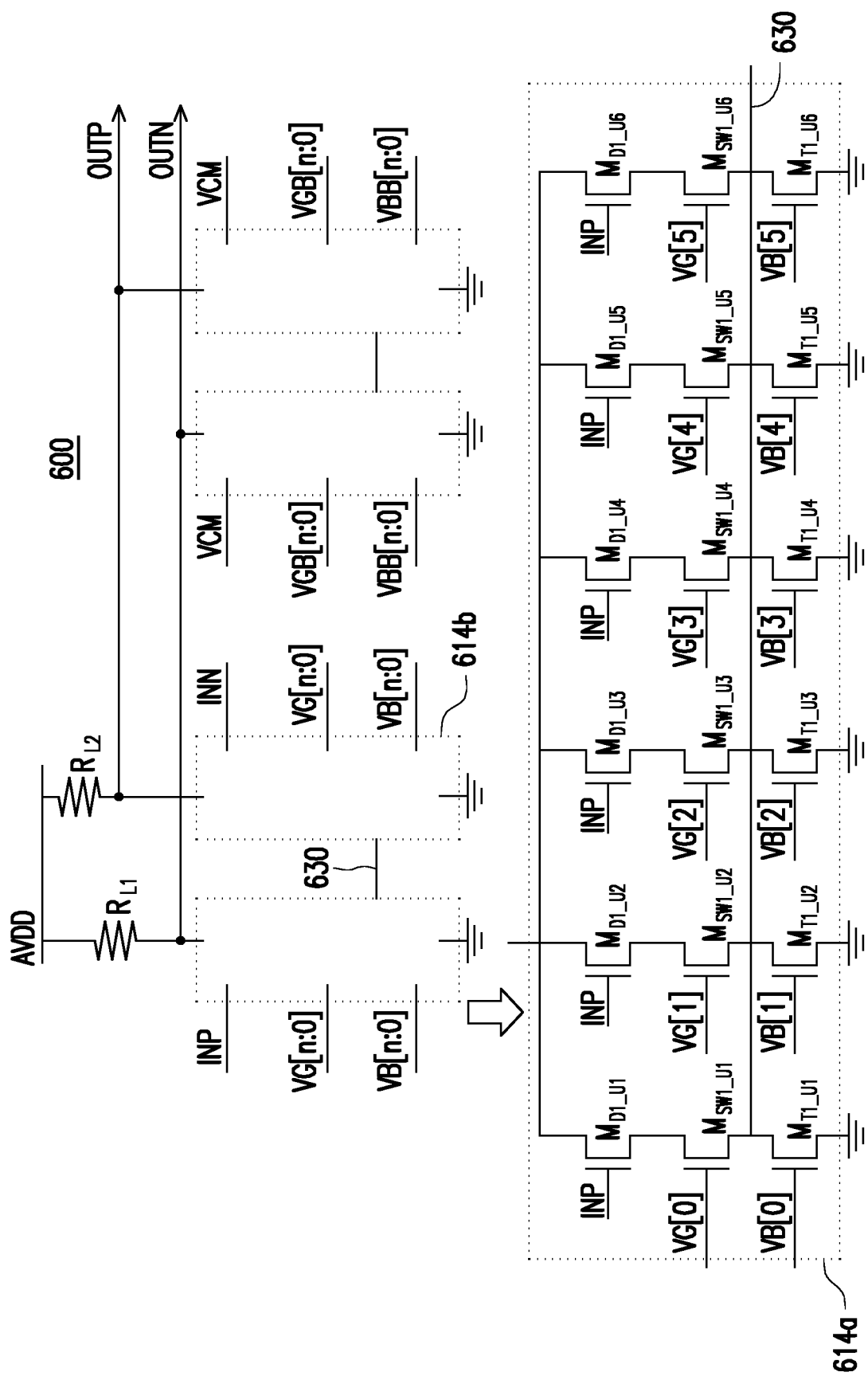
FIG. 6 shows an example VGA of the type shown in FIG. 1, with a six-bit gain control in accordance with some embodiments.

In accordance with some embodiments, an amplifier or equalizer with finer levels of gain tuning can be implemented. For example, a VGA 600 with a six-bit tunable gain can be implemented as shown in FIG. 6, i.e., with each effective transistor in FIG. 1 implemented by six transistors in FIG. 6. In this example embodiment, the gain input VG is a six-bit input, ranging from VG=000000 to VG=111111. In addition, ratios between the "sizes" of the current-generating transistors are 1:2:4:8:16:32. Again, the common-mode gain input VGB can be set to be 1's complement of VG (e.g., VGB=100000 for VG=011111). Maximum gain occurs at VG=111111; minimum gain occurs at VG=000000. (In FIG. 6, like in FIG. 5, the detailed implementation of only one input-bias circuit 614a is shown in detail. The other input-bias circuit 614b of the VGA circuit 600 in this embodiment is identically implemented as the input-bias circuit 614a. A conductive line 630 in this example embodiment connects the first main electrodes of the current-generating transistors in both the input-bias circuits 614a and 614b.)

Figure 7:
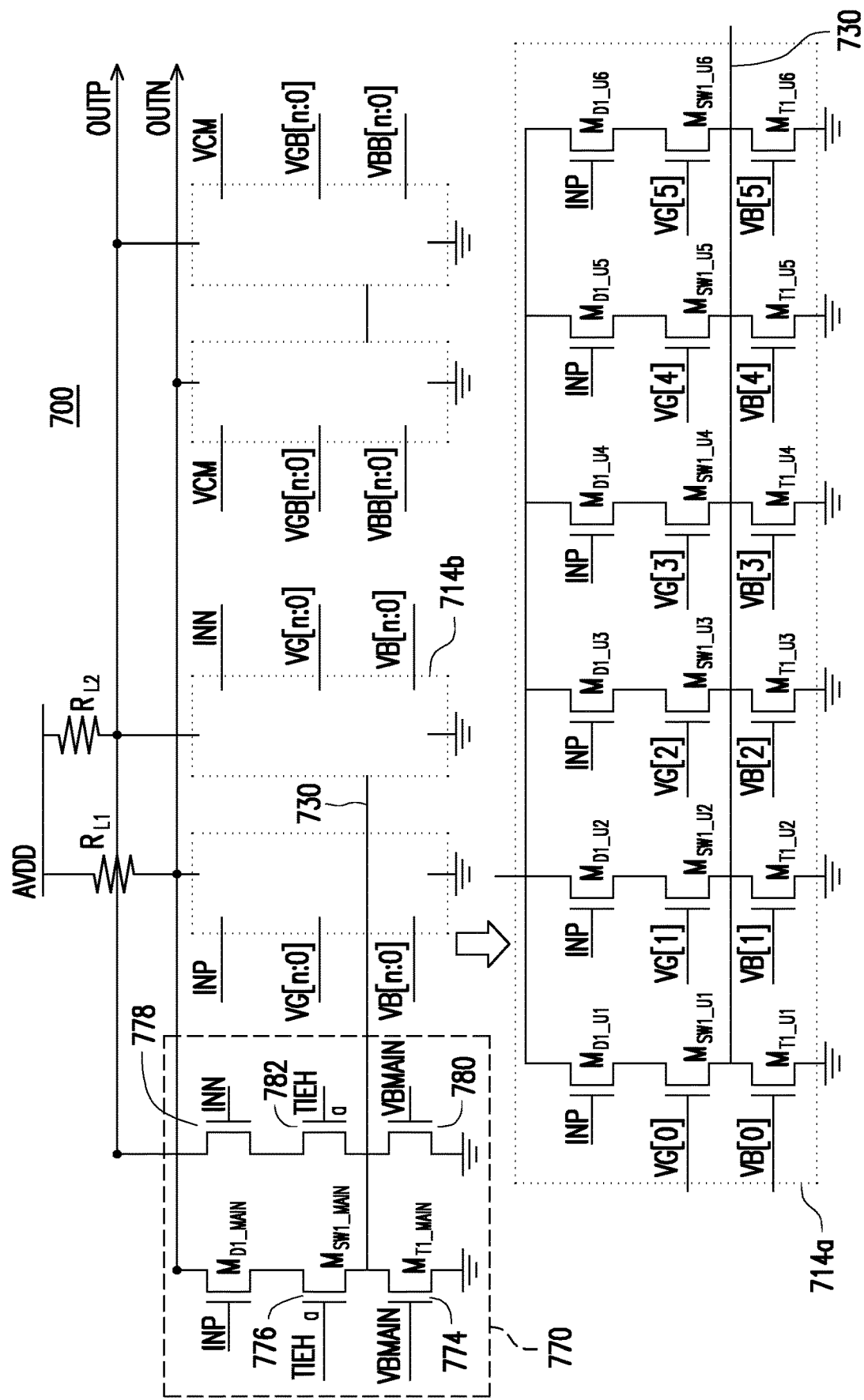
FIG. 7 shows an example VGA of the type shown in FIG. 1, with another six-bit gain control in accordance with some embodiments.

In accordance with some embodiments, an amplifier or equalizer with non-zero tunable gain can be implemented. With reference to FIG. 7, a VGA 700 with a non-zero six-bit tunable gain can be implemented. The VGA 700 is otherwise the same as the VGA 600 in FIG. 6, except that an additional input-bias circuit 770 is added to the input-bias circuits 714a, 714b. In this example, the gain input VG can range from 000000 to 111111 as for the VGA 600 in FIG. 6. However, the control electrodes of 776a,782a of the switching transistors 776,782 in the input-bias circuit 770 are tied to a high state (or a state that keep the transistor on), ensuring that the total gain never becomes zero, (In FIG. 7, like in FIG. 5, the detailed implementation of only one input-bias circuit 714a is shown in detail. The other input-bias circuit 714b of the VGA circuit 600 in this embodiment is identically implemented as the input-bias circuit 714a. A conductive line 730 in this example embodiment connects the first main electrodes of the current-generating transistors in both the input-bias circuits 714a and 714b.)

The circuits according to some embodiments can be implemented with any suitable components. For example, all transistors can be field-effect transistors (FETs), with the control electrodes being gate electrodes, first main electrodes being drain electrodes and second main electrodes being source electrodes. However, other types of devices, such as bipolar transistors, can also be used. As another example, differential amplifiers in accordance to some embodiments are source-coupled amplifiers. However other configurations, such as drain-coupled amplifiers can also be used.

Figure 8:
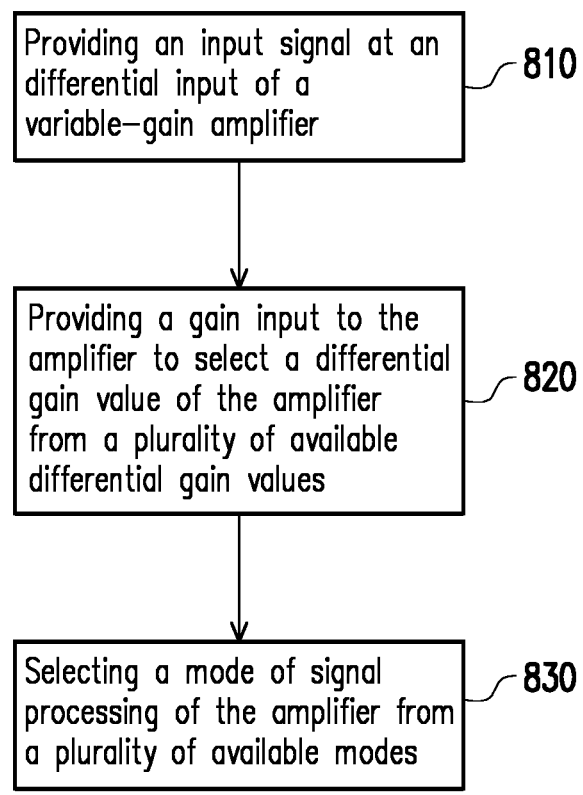
FIG. 8 shows a flow chart for a method in accordance with some embodiments.
Figure 10:
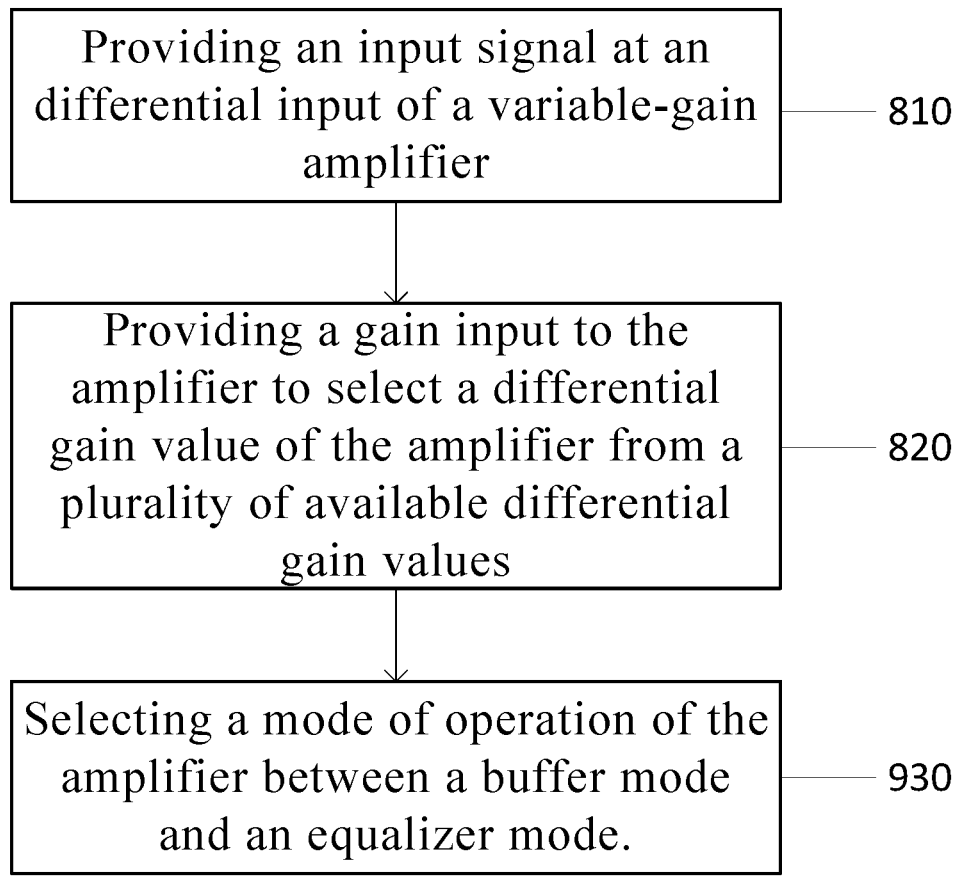
FIG. 10 shows a flow chart for a method in accordance with some embodiments.

Using the VGA/equalizer combination according to some embodiments, a signal processing method can be carried out with advantageous results. As outlined in FIG. 8, according to some embodiments, a method 800 of signal processing includes providing an input signal at a differential input of a variable-gain amplifier (810); providing a gain input to the amplifier to select a differential gain value of the amplifier from a plurality of available differential gain values (820); and selecting a mode of signal processing of the amplifier from a plurality of available modes (830). Examples of different modes, as shown in FIG. 10, include one or more buffer modes and one or more equalizer modes (930). In accordance with some embodiments, different modes may be selected by coupling the current sources, such as the first main electrodes 120b, 126b of the effective current generating transistors 120,126 with different circuit elements. For example, one or more buffer modes may be selected by coupling the current sources with a conductive or resistive path; an equalizer mode can be selected by coupling the current sources with a resistor-capacitor combination; and an equalizer with a different frequency response can be selected by coupling the current sources with a different resistor-capacitor combination.

Figure 2:
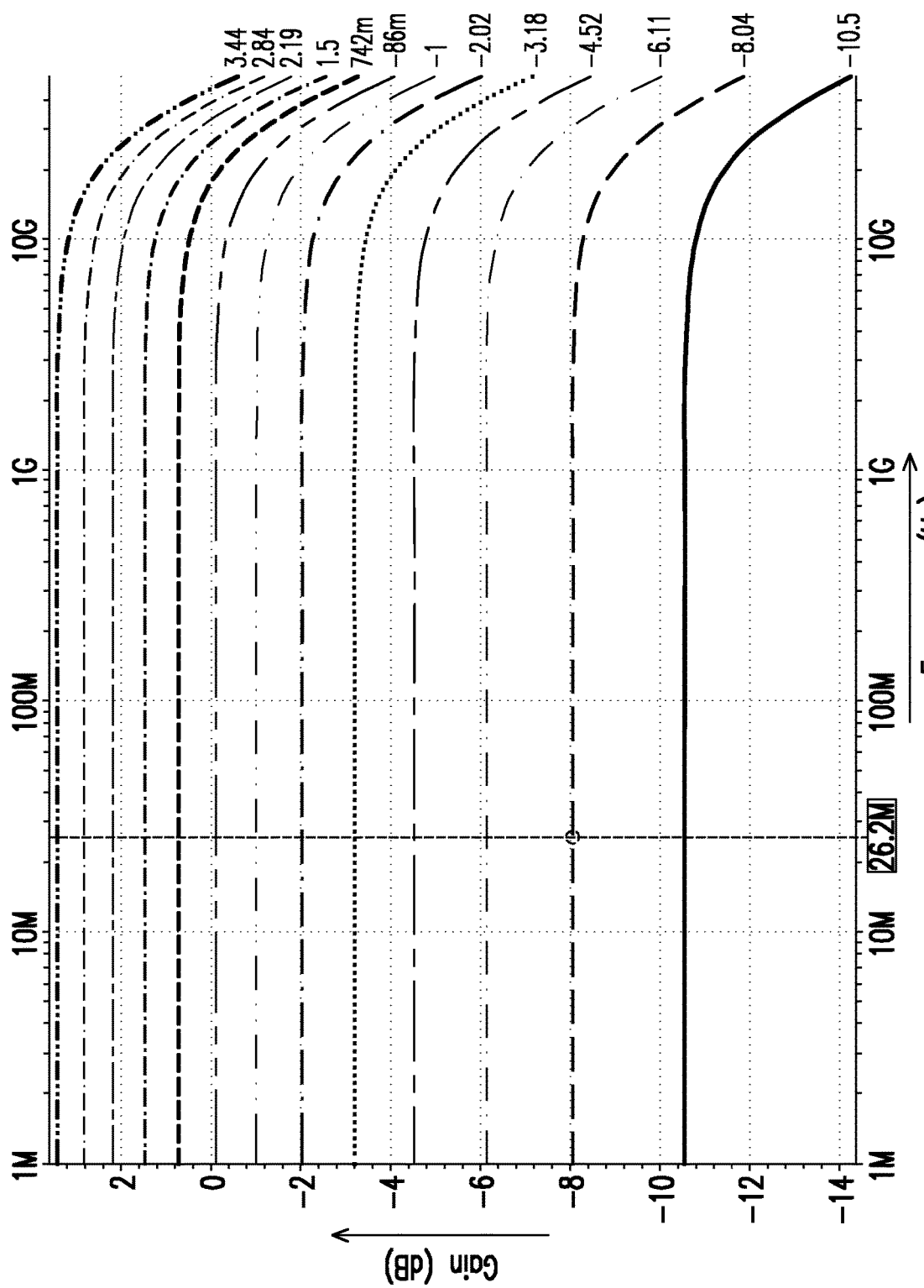
FIG. 2 shows an example spectral response for a VGA of the type shown in FIG. 1 in accordance with some embodiments.

The circuits in accordance with some embodiments can be configured as VGAs with a variable gain without the drawbacks of using a degeneration resistor, particularly without over-peaking associated with parasitic capacitance. An example of frequency response (gain vs. frequency) for a VGA shown in FIG. 1, with a four-bit tunable gain range, is shown in FIG. 2. Here, the amplifier gain is plotted against small-signal frequency for various gain tuning settings (i.e., VB codes). The frequency response i.e., gain as a function of frequency, for this circuit is substantially flat from 1 MHz to about 10 GHz, decreases rapidly at frequencies higher than 10 GHz over a range of tuned gain inputs. The gain does not have high frequency peaking within the tunable range, a result of digitally adjusting bias currents instead of using a degeneration variable resistor. Thus, a voltage gain control buffer without any unwanted overpeaking (higher gain amplitudes) in high frequency is achieved. The reduction or elimination of overpeaking results in reduced distortion in signal transmission as indicated by, for example, eye diagrams. Such reduction in distortion is advantageous to high-data-rate communication systems, such as those employing pulse-amplitude-modulation (PAM), PAM-4, for example.

Figure 3:
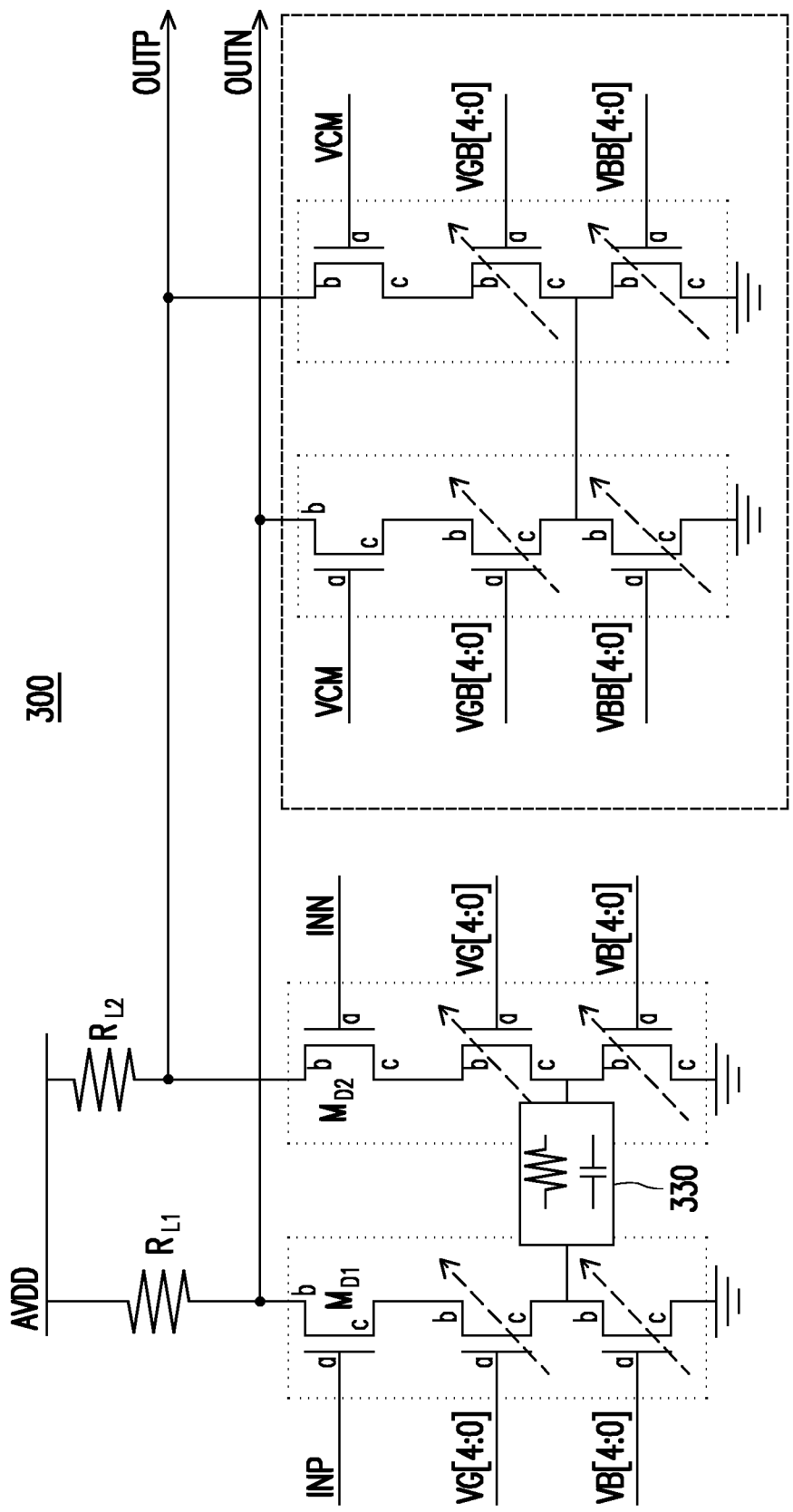
FIG. 3 shows a schematic diagram of a combination VGA/continuous time linear equalizer (VGA/CTLE) in accordance with some embodiments.
Figure 4:
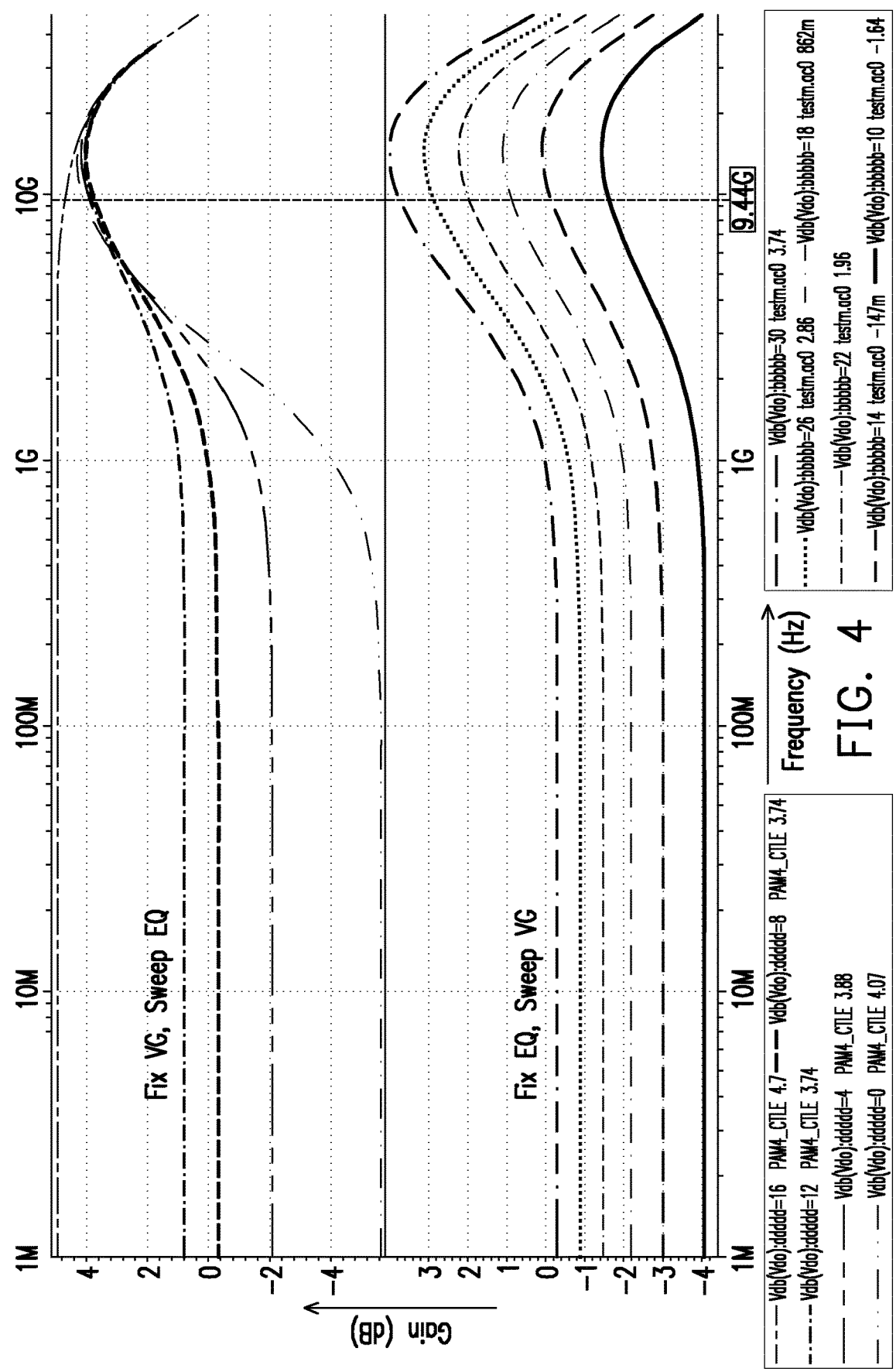
FIG. 4 shows an example spectral response for a combination VGA/CTLE of the type shown in FIG. 3 in accordance with some embodiments.

Similarly, FIG. 4 demonstrates the flexibility afforded by the circuit in tuning both the gain and equalization. Shown in FIG. 4 is the frequency response of an amplifier configured as a CTLE circuit as shown in FIG. 3, with a four-bit tunable gain range. The frequency response for the CTLE, with VB code fixed, but different high-frequency-boosting power chosen for the equalizer unit 330, is shown in the upper portion of FIG. 4; the frequency response for the CTLE, with a fixed equalizer unit configuration but different gain input (VG) values, is shown in the lower portion of FIG. 4. In each case, the gain is substantially flat from about 1 MHz to about 1 GHz and shows an emphasis, or higher amplitude, between about 1 GHz and about 10 GHz for compensating high-frequency loss in certain applications. For some applications, it is advantageous to set the gain (VG) to the maximum value when the amplifier is used as a CTLE, but the capability of tunable gain even for the CTLE mode offers additional flexibility.

According to certain embodiments, the circuits can be configured in the buffer mode or the equalizer mode, depending on the application. For example, for short-channel applications, where spectral distortion is low and simple amplification is needed, a circuit according to certain embodiments disclosed herein can be used and configured in the buffer mode. As another example, for long-channel applications, where signal loss at higher frequencies (or more general spectral distortions) require correction or compensation, a circuit according to certain embodiments disclosed herein can be used and configured in the equalizer mode to provide: emphasis in the high-frequency range. The overall bandwidth of the circuit according some embodiments is improved because the equalizer, having its own variable gain, does not need to follow a separate VGA for gain. For example, the overall bandwidth of three cascading CTLEs in according to some embodiments is about 0.5* (bandwidth of a single band), a 65% improvement over the traditional configuration of CTLEs following VGAs.

Accordingly, the various embodiments disclosed herein provide a combination amplifier/equalizer with a tunable gain without some of the drawbacks of using a degeneration variable resistor, resulting in improved bandwidth, and reduced over-peaking and spectral distortion. The ability to configure the circuit as a buffer as well as an equalizer, both with tunable gain, provides added flexibility in the application of the circuit.

Thus, in accordance with certain disclosed embodiments, a circuit includes a differential amplifier adapted to receive pair of input signals at a respective pair of input terminals and provide at an output terminal an output. The output representing a gain of the difference between the two input signals. The differential amplifier has a gain input terminal and is adapted to set the gain in response to a gain input at the gain input terminal. The circuit also includes a common-mode controller adapted to receive a signal corresponding to a common-mode signal of the input signals. The common-mode signal in some embodiment is a common-mode voltage but can also be common-mode current in other embodiments. The common-mode controller has an output connected to the output terminal of the differential amplifier. The common-mode controller also has, a common-mode gain input terminal and is adapted to set a common-mode gain of the circuit in response to a common-mode gain input at the common-mode gain input terminal.

In according to further embodiments, a circuit includes a differential amplifier, which includes a first pair of transistors, each having a control electrode adapted to receive a respective input signal. The transistor further includes a first main electrode adapted to provide an output signal, and a second main electrode. The circuit further includes a pair of loads, each connected first main electrodes of one of the transistors, and a first voltage supply; and a pair of current sources. Each of the current sources is connected between the second main electrode of one of the pair of transistors, and a second voltage supply, and adapted to output a current of a variable magnitude. The differential amplifier is switchable between a buffer mode and an equalizer mode.

In accordance with still further embodiments, a signal processing method includes providing an input signal at a differential input of a variable-gain amplifier. The method further includes providing a gain input to the amplifier to select a differential gain value of the amplifier from two or more available differential gain values. The method further includes selecting a mode of signal processing of the amplifier from two or more available modes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a differential amplifier adapted to receive a pair of input signals at an input of a respective pair of input terminals and provide at a first output a differential output signal representing a gain of the difference between the pair of input signals, the differential amplifier having a gain input terminal and being adapted to set the gain in response to a gain input at the gain input terminal; and a common-mode controller adapted to receive a signal corresponding to a common-mode signal of the pair of input signals and having a second output connected to the first output, the common-mode controller having a common-mode gain input terminal and being adapted to set a common-mode gain of the circuit in response to a common-mode gain input at the common-mode gain input terminal.

2. The circuit of claim 1, wherein the common-mode controller is adapted to maintain a common-mode gain for different values of the gain of the differential amplifier.

3. The circuit of claim 1, wherein the common-mode controller is adapted to maintain a common-mode gain in response to a common-mode gain input that is correlated to the gain input of the differential amplifier.

4. The circuit of claim 1, wherein the gain input of the differential amplifier and common-mode gain input are digital inputs and are complements of each other.

5. The circuit of claim 1, wherein the differential amplifier is switchable between a buffer mode and an equalizer mode.

6. The circuit of claim 5, wherein the first output comprises a pair of output terminals, and the differential amplifier comprises a first and second input-bias circuits, each comprising:
a first plurality of transistors, each having a control electrode, a first main electrode, and a second main electrode, the control electrodes being connected to each other and to a respective one of the input terminals, the first main electrodes being connected to each other and to a respective one of the pair of output terminal; and
a first plurality of current sources, each connected between the second main electrode of a respective one of the first plurality of transistors and a first voltage supply;
the differential amplifier further comprising:
a first and second load, each connected between a second voltage supply and the first main electrodes of the first plurality of transistors of a respective one of the input-bias circuits.

7. The circuit of claim 6, wherein the differential amplifier further comprises a plurality of connecting elements alternately connectable between the first and second current sources, a first one of the plurality of connecting elements being adapted to, when connected between the first and second current sources, place the differential amplifier in a buffer mode, and a second one of the plurality of connecting elements being adapted to, when connected between the first and second current sources, place the differential amplifier in an equalizer mode.

8. The circuit of claim 7, wherein the first one of the plurality of connecting elements is substantially purely resistive, and the second one of the plurality of connecting elements has a frequency-dependent gain.

9. The circuit of claim 6, wherein the common-mode controller comprise a first and second branch circuits, each comprising:
a second plurality of transistors, each having a control electrode, a first main electrode, and a second main electrode, the control electrodes of the second plurality of transistors adapted to receive a signal corresponding to the common-mode signal of the input signals, the first main electrodes adapted to receive the output signal from a respective one of the input-bias circuits; and
a second plurality of current sources, each connected between the second main electrode of a respective one of the second plurality of transistors and the first voltage supply, the second plurality of current sources being adapted to provide a variable current through the respective branch circuit.

10. The circuit of claim 9, wherein each of the current sources in the differential amplifier and common-mode controller comprises:
a current generating transistor having a control electrode, a first main electrode and a second electrode, the second electrode being connected to the first voltage supply, the control electrode being adapted to receive a bias signal; and
a switching transistor having a control electrode, first main electrode and a second electrode, wherein
in the differential amplifier, the control electrode of the of the switching transistor is adapted to receive at least a part of the gain input, and the switching transistor is adapted to open and close a connection between the second main electrode of a respective one of the first plurality of the transistors and the first main electrode of the current generating transistor, and
in the common-mode controller, the control electrode of the of the switching transistor is adapted to receive at least a part of the common-mode gain input, and the switching transistor is adapted to open and close a connection between the second main electrode of a respective one of the second plurality of the transistors and the first main electrode of the current generating transistor.

11. The circuit of claim 1, wherein the differential amplifier has a variable gain and is without a degeneration resistor.

12. The circuit of claim 10, wherein, within each of the first and second plurality of current sources, one of the plurality of current-generating transistors is adapted to generate through the first electrode a current that is multiple times of a current generated through the first electrode of another one of the plurality of current-generating transistors.

13. A circuit, comprising:
a differential amplifier, comprising:
a first pair of transistors, each having a control electrode adapted to receive a respective input signal; a first main electrode adapted to provide an output signal; and a second main electrode;
a pair of loads, each connected between the first main electrode of a respective one of the pair of transistors and a first voltage supply; and
a pair of current sources, each connected between the second main electrode of a respective one of the pair of transistors and a second voltage supply, and adapted to output a current of a variable magnitude,
the differential amplifier being switchable between a buffer mode and an equalizer mode,
wherein the differential amplifier comprises a plurality of connecting elements alternately connectable between the pair of current sources, a first one of the plurality of connecting elements being adapted to, when connected between the pair of current sources, place the differential amplifier in a buffer mode, and a second one of the plurality of connecting elements being adapted to, when connected between the pair of current sources, place the differential amplifier in an equalizer mode.

14. The circuit of claim 13, wherein the first one of the plurality of connecting elements is substantially purely resistive, and the second one of the plurality of connecting elements has a frequency-dependent gain.

15. The circuit of claim 13, further comprising a common-mode controller, comprising:
a second pair of transistors, each having a control electrode; a first main electrode adapted to receive a respective one of the output signals; and a second main electrode, the control electrodes of the second pair of transistors adapted to receive a signal corresponding to a common-mode signal of the input signals; and
a pair of current sources, each connected between the second main electrode of a respective one of the pair of transistors and the second voltage supply.

16. The circuit of claim 14, wherein the second one of the plurality of connecting element comprises a resistor-capacitor combination, the circuit further comprising a switching device connected and adapted to selectively connecting the first and second ones of the plurality of connecting elements between the pair of current sources.

17. A signal processing method, comprising:
providing a differential input signal at a differential input of a voltage-gain amplifier having a variable gain, the voltage-gain amplifier having:
a first pair of transistors, each having a control electrode adapted to receive a respective input signal of the differential input signal;
a first main electrode adapted to provide an output signal; and a second main electrode;
a pair of loads, each connected between the first main electrode of a respective one of the pair of transistors and a first voltage supply; and
a pair of current sources, each connected between the second main electrode of a respective one of the pair of transistors and a second voltage supply, and adapted to output a current of a variable magnitude;
providing a gain input to the voltage-gain amplifier to select a differential gain value of the voltage-gain amplifier from a plurality of available differential gain values; and
selecting a mode of operation of the voltage-gain amplifier between a buffer mode and an equalizer mode, wherein the selecting the mode of operation comprises alternately coupling the pair of current sources with a conductive path and a resistor-capacitor combination.

18. The method of claim 17, further comprising providing a common-mode gain input to the voltage-gain amplifier to set a common-mode gain of the input signal, wherein:
the providing a gain input comprises providing a digital gain input, and
the providing a common-mode gain input comprise providing a digital common-mode gain input bearing a predetermined relationship with the digital gain input.

* * * * *